United States Patent
Gates et al.

(10) Patent No.: US 6,780,499 B2
(45) Date of Patent: Aug. 24, 2004

(54) ORDERED TWO-PHASE DIELECTRIC FILM, AND SEMICONDUCTOR DEVICE CONTAINING THE SAME

(75) Inventors: Stephen McConnell Gates, Ossining, NY (US); Christopher B. Murray, Ossining, NY (US); Satyanarayana V. Nitta, Poughquag, NY (US); Sampath Purushothaman, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 317 days.

(21) Appl. No.: 09/848,153

(22) Filed: May 3, 2001

(65) Prior Publication Data

US 2002/0164891 A1 Nov. 7, 2002

(51) Int. Cl.⁷ .............. B32B 5/18; B32B 3/10; B32B 5/32; C08J 9/26
(52) U.S. Cl. .......... 428/315.7; 428/116; 428/209; 428/446; 428/447; 428/450; 428/304.4; 428/308.4; 428/312.2; 428/312.6; 428/315.5; 428/318.4; 428/319.1; 428/319.3; 428/332; 521/61; 521/76; 521/154; 427/189; 427/198; 427/199; 427/201; 427/226; 427/243; 427/245; 427/343; 427/344; 427/340; 427/373; 427/379; 427/387
(58) Field of Search .............. 428/315.7, 116, 428/209, 446, 447, 332, 450, 304.4, 308.4, 312.2, 312.6, 315.5, 318.4, 319.1, 319.3, 312.1, 30.6; 521/61, 76, 154; 427/387, 189, 198, 199, 201, 226, 243, 245, 343, 344, 340, 373, 379

(56) References Cited

U.S. PATENT DOCUMENTS

| | | | |
|---|---|---|---|
| 5,393,712 A | | 2/1995 | Rostoker et al. |
| 5,470,801 A | | 11/1995 | Kapoor et al. |
| 5,561,318 A | * | 10/1996 | Gnade et al. ............... 257/638 |
| 5,598,026 A | | 1/1997 | Kapoor et al. |
| 5,801,092 A | * | 9/1998 | Ayers ........................ 438/623 |
| 6,171,687 B1 | * | 1/2001 | Leung et al. ............ 428/304.4 |
| 6,329,062 B1 | * | 12/2001 | Gaynor ...................... 428/447 |
| 6,440,560 B1 | * | 8/2002 | Gates et al. ................ 428/403 |
| 6,565,763 B1 | * | 5/2003 | Asakawa et al. ............. 216/56 |
| 2003/0006477 A1 | * | 1/2003 | Gallahger et al. .......... 257/527 |
| 2003/0008989 A1 | * | 1/2003 | Gore et al. ................. 526/227 |

OTHER PUBLICATIONS

Okura et al., JP 10–284602 Oct. 1998, Machine Translation obtained from JPO web–site.*

* cited by examiner

Primary Examiner—Jeffrey B. Robertson
(74) Attorney, Agent, or Firm—Scully, Scott, Murphy & Presser; Daniel P. Morris

(57) ABSTRACT

A porous, low-k dielectric film that has good mechanical properties as well as a method of fabricating the film and the use of the film as a dielectric layer between metal wiring features are provided. The porous, low-k dielectric film includes a first phase of monodispersed pores having a diameter of from about 1 to about 10 nm that are substantially uniformly spaced apart and are essentially located on sites of a three-dimensional periodic lattice; and a second phase which is solid surrounding the first phase. Specifically, the second phase of the film includes (i) an ordered element that is composed of nanoparticles having a diameter of from about 1 to about 10 nm that are substantially uniformly spaced apart and are essentially arranged on sites of a three-dimensional periodic lattice, and (ii) a disordered element comprised of a dielectric material having a dielectric constant of about 2.8 or less.

57 Claims, 5 Drawing Sheets

ORDERED TWO-PHASE DIELECTRIC FILM, AND SEMICONDUCTOR DEVICE CONTAINING THE SAME

FIELD OF THE INVENTION

The present invention relates to interconnect structures for high-speed microprocessors, application specific integrated circuits (ASICs), and other high-speed integrated circuits (ICs). Specifically, the present invention provides low dielectric constant (i.e., low-k) interconnect structures having enhanced circuit speed. Moreover, the structures of the present invention are mechanically stronger than conventional structures with a similar dielectric constant. The structures of the present invention comprise at least a porous, low-k dielectric film which is mechanically stronger than prior art films with a similar dielectric constant.

BACKGROUND OF THE INVENTION

The semiconductor industries drive to continually improve density and performance has forced the use of advanced interconnect structures. For example, copper, Cu, has been recently introduced as a wiring technology for 0.25 $\mu$m generation and below products, and by the 0.13 $\mu$m generation, it is expected that the low-k dielectrics (materials having a relative dielectric constant, k, of about 3.8 or below) will be combined with such interconnects to further improve performance.

In the case of metallization, the choice of the new wiring material is reasonably straight forward, but the choice of the intermetal dielectric (IMD) is not as clear. Many new low-k dielectrics which are based on organic or glass materials have become recently available to the semiconductor industry; See, for example, co-assigned U.S. application Ser. No. 09/360,738; U.S. Pat. No. 6,440,560 to Gates, et al.; U.S. Pat. No. 5,393,712 to Rostoker, et al; U.S. Pat. No. 5,470,801 to Kapoor, et al.; and U.S. Pat. No. 5,598,026 to Kapoor, et al.

Extensive characterization and integration efforts are however needed to select appropriate candidates and then incorporate these materials into semiconductor products.

During the material selection process for IMD, emphasis is often placed on the electrical and chemical properties of the material. For example, an IMD for advanced interconnect applications must exhibit a low-dielectric constant, low-leakage, high-breakdown strength and good thermal stability at typical processing temperatures.

Although there maybe great emphasis on these properties during the initial evaluation process, mechanical properties and manufacturability issues play a large role, perhaps even a dominant role, in the selection of a dielectric for use in semiconductor manufacturing. For example, process operations such as chemical-mechanical polishing (CMP) and packaging operations may damage soft dielectric structures; therefore, the mechanical properties and manufacturability must also be taken into careful consideration when selecting an IMD.

In view of the drawbacks mentioned hereinabove concerning low-k dielectrics, there is a need for developing a new porous, low-k dielectric film that has improved mechanical properties compared with prior art low-k dielectrics.

SUMMARY OF THE INVENTION

One object of the present invention is to provide a low-k dielectric film having a dielectric constant, k, of less than about 2.0, preferably about 1.8 or less. It is noted that all dielectric constants reported herein are given in respect to a vacuum, unless otherwise stated.

Another object of the present invention is to provide a low-k dielectric film having superior mechanical properties (especially, a hardness of about 0.2 GPa or greater, and a Modulus of about 2.0 GPa or greater).

A further object of the present invention is to provide a low-k dielectric film having pores that are substantially uniform in size (size selected with a controllable diameter in the range of from about 1 to about 10 nm), and that are substantially uniformly spaced apart and essentially periodic in location.

An even further object of the present invention is to provide a low-k dielectric film that has pores having a diameter of about 1 to about 10 nm which are not connected and are separated by a low-dielectric constant matrix material.

Other objects of the present invention include:

providing a method of fabricating films which have the properties mentioned above.

providing a gapfill thin film wiring structure on an integrated circuit (IC) wherein the inventive porous, low-k dielectric film is employed as the dielectric layer between metal lines.

providing a dual damascene type thin film wiring structure on an integrated circuit (IC) wherein the inventive porous, low-k film is employed as the dielectric layer between metal wiring features.

These and other objects and advantages are achieved in the present invention by providing a porous dielectric film that comprises two phases. The first phase of the inventive dielectric film is comprised of nanometer scale pores (i.e., voids) that are substantially uniform in size, size selected with a diameter in the 1–10 nm range and that are uniformly spaced apart and essentially periodic in location. The second phase of the inventive film, which is a solid phase, is comprised of a low-dielectric constant matrix with nanometer scale particles dispersed within the matrix. The nanometer scale particles may be comprised of Si, C, O and H or another material and are substantially uniformly spaced apart and essentially periodic in location.

Specifically, the inventive porous, low-k dielectric film of the present invention comprises:

a first phase of monodispersed pores having a diameter of from about 1 to about 10 nm that are substantially uniformly spaced apart and are essentially located on sites of a three-dimensional periodic lattice; and a second phase surrounding said first phase, wherein said second phase is a solid phase which includes (i) an ordered element that is composed of nanoparticles having a diameter of from about 1 to about 10 nm that are substantially uniformly spaced apart and are essentially arranged on sites of a three-dimensional periodic lattice, and (ii) a disordered element comprised of a dielectric material having a dielectric constant of less than about 2.8.

The nanoparticles employed in the present invention may be comprised of Si, C, O and H or any other nanoparticle that fits the above description.

A further aspect of the present invention relates to interconnect structures which include at least the porous, low-k dielectric film of the present invention as one of the essential structural components. In the interconnect structures, the inventive porous, low-k dielectric is employed as the dielectric layer that is formed between metal wiring features.

Another aspect of the present invention relates to a method of fabricating the above-mentioned porous, low-k dielectric film. Specifically, the method of the present invention comprises the steps of:

(a) coating a suspension of water soluble or water vapor soluble oxide particles with a surface ligand group which is effective in preventing agglomeration of said oxide particles, yet maintains solubility of the oxide particles in said suspension, while separately forming monodispersed, e.g. SiCOH, particles having a particle diameter of from about 1 to about 10 mn;

(b) adding said coated water soluble or water vapor soluble oxide particles and said monodispersed particles to a solution containing a dielectric binder material having a dielectric constant of about 2.8 or less so as to form a precursor mixture;

(c) coating said precursor mixture on a surface of a substrate;

(d) subjecting said coated precursor mixture to a curing process, said curing process including at least a step which is capable of ordering of said particles in a three-dimensional lattice and a step of forming a crosslinked film;

(e) removing said coated water soluble or water vapor soluble oxide particles from said crosslinked film so as to form pores in said film; and (f) annealing said film containing said pores so as to remove residual water and hydroxyl groups from said film, wherein said film comprises a first phase of monodispersed pores having a diameter of from about 1 to about 10 nm that are substantially uniformly spaced apart and are essentially located on sites of a three-dimensional periodic lattice originally occupied by the water soluble or vapor soluble oxide particles; and a second phase surrounding said first phase, wherein said second phase is a solid phase which includes (i) an ordered element that is composed of nanoparticles having a diameter of from about 1 to about 10 nm that are substantially uniformly spaced apart and are essentially arranged on sites of a three-dimensional periodic lattice, and (ii) a disordered element comprised of said binder.

DETAILED DESCRIPTION OF THE INVENTION

Figure 1A:
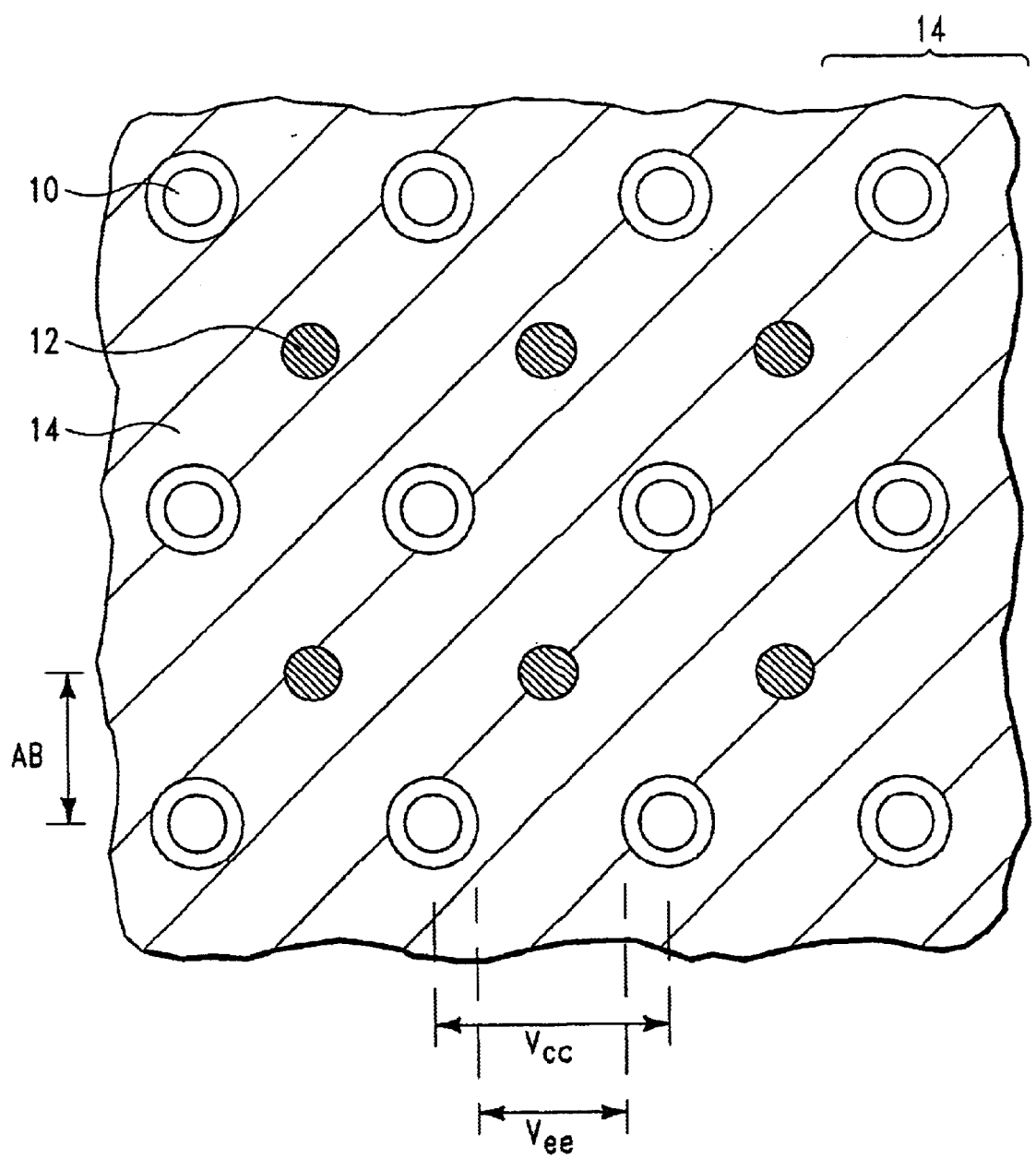
FIGS. 1A–C are pictorial views of the inventive porous, low-k dielectric film through various planes.
Figure 1B:
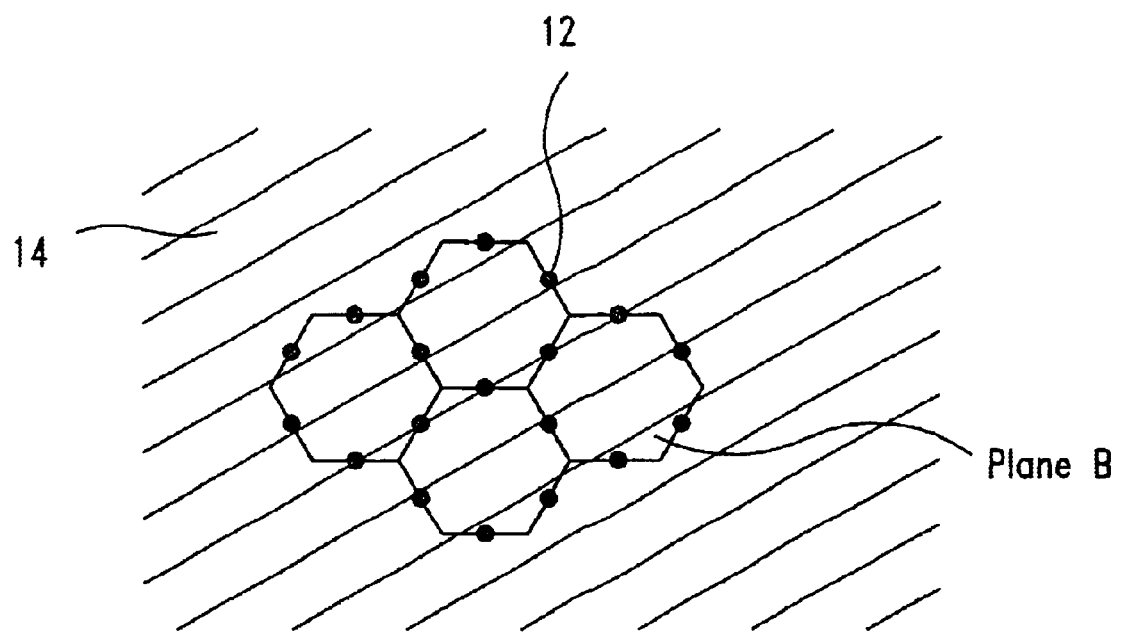
Figure 1C:
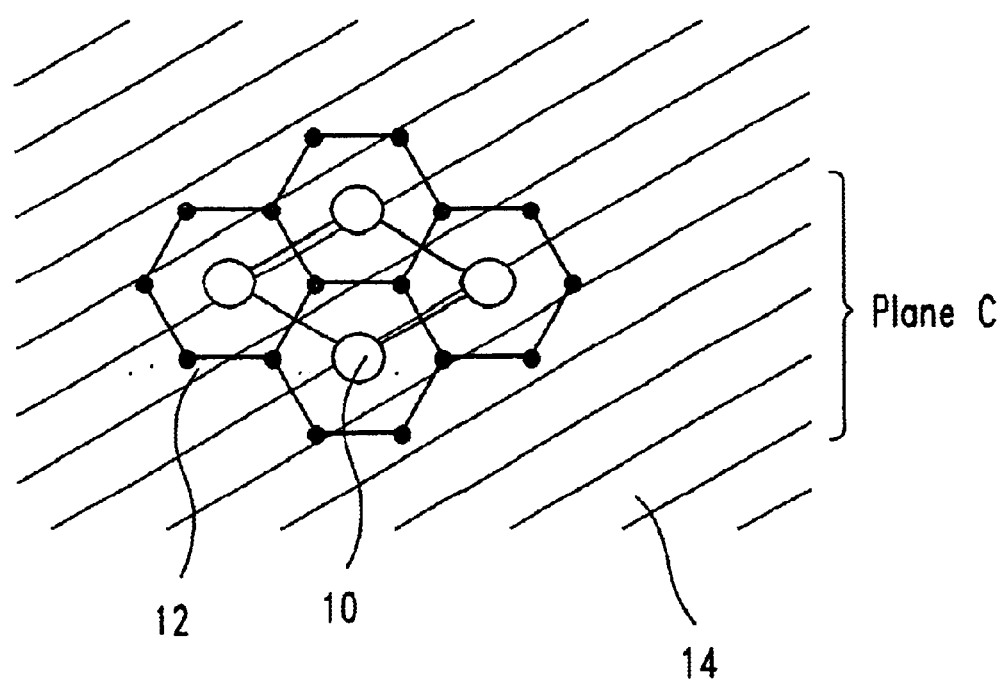
Figure 1D:
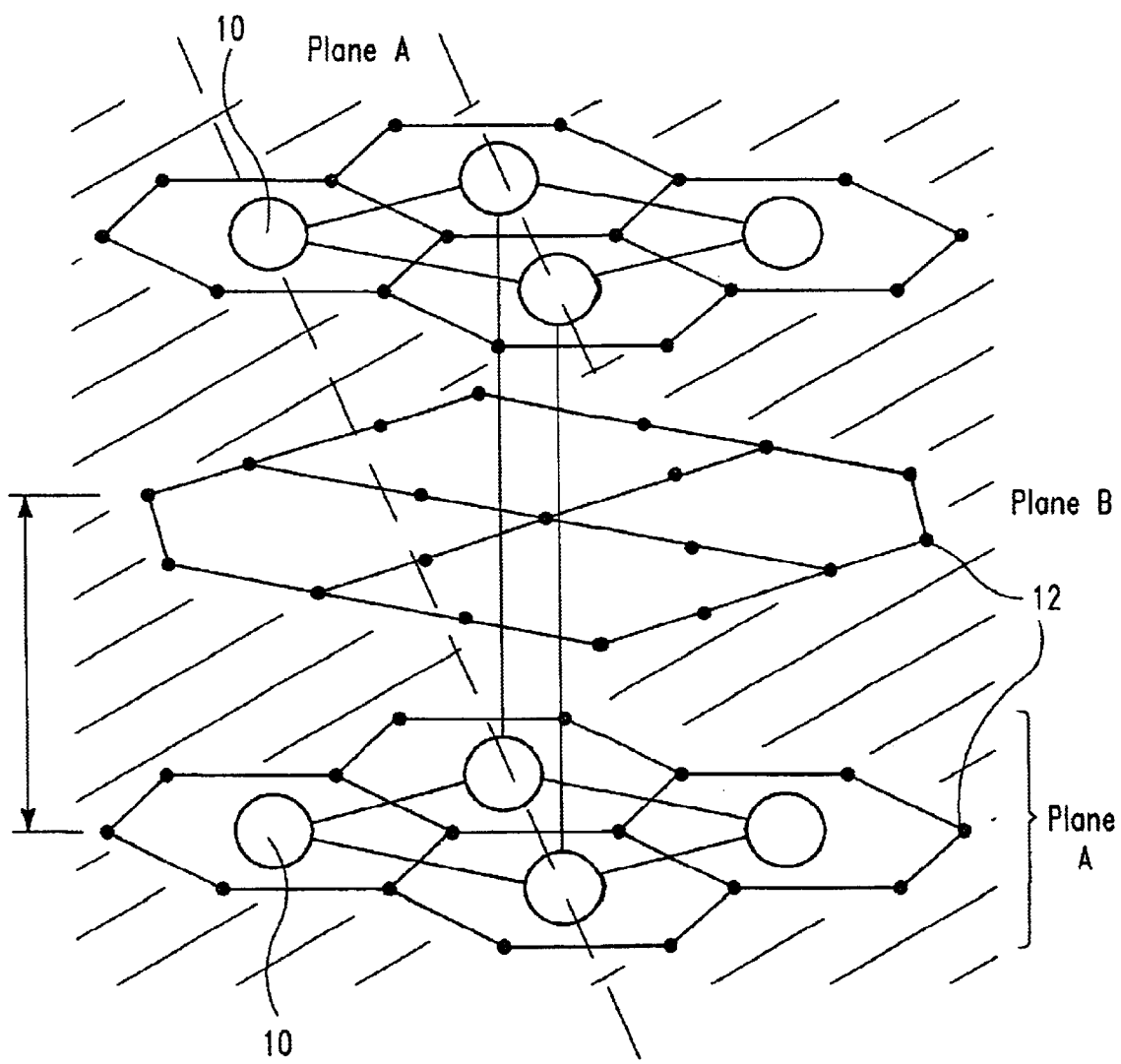
FIG. 1D is a schematic three-dimensional drawing of the inventive film, showing planes A, B and C.

The present invention, which provides a porous, low-k dielectric film having superior mechanical strength than conventional porous dielectric films, will now be described in more detail by referring to the drawings that accompany the present invention.

Reference is first made to FIGS. 1A–D which are pictorial representations of the porous, low-k dielectric film of the present invention through various planes. The planes shown in these drawings are identified in FIG. 1D. As shown in FIGS. 1A–D, the inventive film includes three distinct components including monodispersed pores 10, nanoparticles 12, and dielectric matrix 14. The monodispersed pores represent the first phase of the inventive film, whereas the nanoparticles and the dielectric matrix represent the second phase of the inventive film. Each of the above-identified components of the inventive porous, low-k dielectric film will now be described in more detail.

Specifically, pores (or voids) 10 of the inventive porous, low-k dielectric film have a diameter of from about 1 to about 10 nm, preferably from about 1 to about 5 nm, with a pore diameter of about 3 nm being most preferred. Moreover, and as shown in FIG. 1A, pores 10 are substantially equally spaced apart and are essentially periodic in location. In particular, pores 10 are located on a three-dimensional lattice. Although pores 10 are specifically depicted as spherical in shape, other shapes, including, but not limited to: elliptical, egg-shaped and cylindrical, are also contemplated herein. Also, the term "diameter" as used herein means the characteristic dimension or approximate size and is not limited to the geometric diameter of a spherical pore.

Nanoparticles 12, which are also present in the inventive film, have a diameter of from about 1 to about 10 nm, and more preferably the diameter of nanoparticles 12 is from about 2.0 to about 3 nm. In accordance with the present invention, nanoparticles 12 are comprised of Si, C, O and H and they are substantially uniformly spaced apart and are essentially arranged on sites of a three-dimensional periodic lattice. In the present invention, the nanoparticles represent the ordered component of the second, i.e., solid, phase. In other embodiments of the present invention, nanoparticles 12 have other compositions.

The other component of the second phase is dielectric matrix (or binder) 14 that completely surrounds pores 10 and nanoparticles 12. The dielectric matrix of the inventive film is non-ordered and is comprised of a low-k dielectric material which has a dielectric constant of about 2.8 or less, preferably about 2.6 or less.

Illustrative examples of types of low-k dielectric materials that can be used in the present invention as the dielectric matrix (or binder) include, but are not limited to: polyarylene ethers, thermosetting polyarylene ethers, aromatic thermosetting resins such as SiLK® (a semiconductor dielectric supplied by The Dow Chemical Company), Si-containing polymers such as organosilsesquioxanes (OSQ) such as methyl- or phenylsilsesquioxane (MSQ or PSQ); hydrogensilsesquioxanes (HSQ); mixtures of OSQ and MSQ; amorphous alloys comprised of Si, C, O and H that may, or may not, be doped with oxide. Mixtures and/or complexes of these low-dielectrics may also be employed in the present invention. Preferred low-k dielectric binders that can be employed as the matrix of the inventive film include: MSQ, PSQ, HSQ and MSQ-HSQ mixtures.

As shown in FIGS. 1A–D, pores 10 are typically separated by the center-center distance $V_{cc}$ and the edge-edge distance $V_{ee}$ and are located on the lattice sites of a periodic three-dimensional lattice. The term "periodic three-dimensional lattice" as used herein denotes a structure with regular repeating units over a range of distances, from a few lattice constants (e.g., 5 or more) to a very large number of lattice constants. The preferred structure of the present invention has ordered pores over distances of from about 50 to about 100 nm, and greater. The distance between pores and nanoparticles is represented by AB. Note that since possible defects in the lattice are part of the inventive film, a pore located on every lattice site is not necessarily required. It is again emphasized that the shape of the pores is not limited to spherical pores. Instead, other shaped pores are also contemplated herein. Also located on lattice sites, and equally spaced, are nanoparticles 12. Again, since possible defects in the lattice are part of the film, a nanoparticle located on every lattice is not required in the present invention.

In accordance with the present invention, the distance $V_{cc}$ is typically from about 2 to about 10 nm, with a distance of from about 3 to about 6 nm being more highly preferred. Insofar as the distance $V_{ee}$ is concerned, that distance is typically of from about 1 to about 8 nm, with a distance of from about 2 to about 5 nm being more highly preferred. The distance AB, on the other hand, is typically of from about 1 to about 10 nm, with a distance of from about 2 to about 5 nm being more highly preferred.

In accordance with the present invention, the porous, low-k dielectric film has a dielectric constant that is less than about 2.0, preferably less than about 1.8. It is noted that the dielectric constant of the inventive films is typically less than that of the binder material because of the presence of pores 10 in the film. Hence, the inventive films typically have an effective dielectric constant that is lower than the binder material used in making the same. As stated above, the inventive porous, low-k dielectric film has an effective dielectric constant of less than about 2.0, preferably about 1.8 or less.

In addition to having low-dielectric constants, the films of the present invention are further characterized as having superior mechanical properties. Specifically, the porous, low-k dielectric films of the present invention have a hardness of about 0.2 GPa or greater, and a Modulus of about 2.0 GPa or greater as measured by nano-indentation testing. More preferably, the inventive porous, low-k dielectric films have a hardness of from about 0.2 to about 0.4 GPa, and a Modulus of from about 2 to about 4 GPa, while exhibiting a dielectric constant of less than about 2.0.

The method used in forming the inventive film described above and shown in FIGS. 1A–D will now be described. The first step of the inventive method includes at least the step of forming a suspension which contains water soluble (or water vapor soluble) oxide particles. The suspension is formed by adding the water soluble (or water vapor soluble) oxide particles to a solvent which is capable of suspending the oxide particles using techniques that are well known to those skilled in the art. Typical solvents that can be employed in the present invention as the suspending media include, but are not limited to: alcohols (such as methanol, ethanol, propanol and butanol), alkanes (such as butane, pentane, hexane, heptane, octane, nonane, decane and dodecane as well as crude distillate fractions such as petroleum, ether or kerosene), ketones (including, but not limited to: acetone, and methyl-ethyl ketone), ethers (such as ethylether, propylether, butylether, pentylether, hexylether, heptylether, octylether, phenylether, and methyl-phenyl ether(anisole)), aromatics (such as benzene, toluene, xylene, and mesetylene), and carboxylic acids (such as acetic acid, propionic acid, and butyric acid).

In the case of alcohols, ketones and carboxylic acids, mixtures with water may be employed so long as the ratio of water and the pH of the solution is such that the oxide particles do not dissolve. Of these solvents, hexane, toluene, ethanol, acetone, methylethylketone, octylether, phenylether are typically employed due to a combination of their efficacy and cost, with hexane, acetone, ethanol being most preferred due to their low boiling points.

The oxide particles employed in the present invention include any oxide particles that are sufficiently soluble in water or water vapor so as to form pores, i.e., voids, in a dielectric matrix upon being immersed in water. Examples of such water soluble or water vapor soluble oxides include, but are not limited: silicon oxide, germanium oxide and the like. Mixtures of oxide particles are also contemplated herein. Another characteristic feature of the oxide particles employed in the present invention is that they be capable of forming pores in a dielectric matrix having a diameter of from about 1 to about 10 nm, preferably from about 1 to about 5 nm, and most preferably about 2.5 mn.

The amount of solvent and oxide particles that are employed in forming the suspension may vary and is not critical to the present invention. Typically, however, from about 1 to about 10 gms of oxide particles are added to about 1000 mls of solvent.

The water soluble or water vapor soluble oxide particles employed in the present invention may be formed utilizing techniques well known to those skilled in the art. In one embodiment of the present invention, it is preferred to use the synthetic procedure disclosed in co-assigned U.S. application Ser. No. 09/360,738, the entire content of which is incorporated herein by reference, to make germanium oxide particles. In that embodiment of the present invention, a water to solvent ratio, $R_w$, of about 1% or less, i.e., $R_w$ is approximately equal to 0, is used to make the smallest germanium oxide particles which typically have a size of from about 1 to about 10 nm.

The suspended water soluble or water vapor soluble oxide particles are then subjected to a step wherein a surface ligand group is coated onto the oxide particles. This step of the present invention is carried out utilizing conventional solution chemistry wherein a compound containing at least the surface ligand group is added to the suspension.

The surface ligand group that is employed in the present invention includes any surface ligand which is effective in preventing agglomerization of the water soluble or water vapor soluble oxide particles, yet is able to maintain the solubility of the oxide particles in the suspension. Suitable surface ligand groups that can be employed in this step of the present invention include, but are not limited to: organosilanes having the formula R'—Si(R")$_3$ wherein R' is an organic moiety containing 4 to 18 carbon atoms in linear or branched form and R" is selected from the group consisting of methoxy, ethoxy, propoxy; or organohalosiloxanes having the formula R'—Si(X)$_3$ wherein R' is as defined above and X is a halide such as F, Cl, Br and I.

In cases above, the Germiloxane analogues, i.e., R'—Ge(R")$_3$ or R'—Ge(X)$_3$ wherein R', R" and X are as defined above, would also be suitable surface active ligands. Similarly long chain carboxylic acids having the formula R$^1$—COOH wherein R$^1$ is an organic moiety containing 4 to 18 carbon atoms in linear or branched form may be employed. In some embodiments, long chain carboxylic acids which include cyclic or aromatic rings may also be employed herein.

Surfactants, i.e., surface ligands, for the nanoparticles growth may include long chain alkylamines having the formula R$^2$$_3$N where as many as two R$^2$ groups could be a hydrogen atom and the other R$^2$ group could be an organic moiety having 4 to 18 carbon atoms in linear or branched form; long chain alcohols having the formula R$^3$OH where R$^3$ is an organic moiety containing from 4 to 18 (linear, branched, cyclic or aromatic) carbon atoms; long chain phosphonic acids having the formula R$^4$—PO$_2$OH wherein $R^4$ is an organic moiety containing 4 to 18 carbon atoms in linear or branched form and which may further include cyclic structures or aromatic rings; and long chain sulfonic acids having the formula $R^5$—$SO_2OH$ wherein $R^5$ is an organic moiety containing 4 to 18 carbon atoms in linear or branched form and which may further include cyclic structures or aromatic rings.

In all of the above-mentioned cases, the organic functionality of the surface ligand may have partial or complete substitution of the hydrogen by fluorine to prepare fluorocarbon analogs of these stabilizing ligands.

Among other possible ligands that can be employed in the present invention, oleic acid is found to be most preferred as a surface ligand, especially in cases where the dispersing medium is octylether or phenylether.

Carbon rich germanium oxide particles (water soluble) can be produced by a procedure identical to that described above with the substitution of germanium alkoxides or germanium halides as precursor rather than the siloxanes and silsesquixoanes.

Although the concentration of the surface ligand groups employed in the present invention may vary, typically from about 0.1 to about 1 wt. % surface ligand group is added to about 1000 mls of the suspension. Following this step of the present invention, chromatography or another like size specific separation technique may optionally be used to size select the coated oxide particles to have a particle diameter in the range from about 1 to about 10 nm.

Before, after or at the same time, as preparation of the coated oxide particles, SiCOH nanoparticles having a particle diameter of from about 1 to about 10 nm are separately prepared utilizing techniques well known to those skilled in the art. For example, the nanoparticles of SiCOH are prepared as follows: The preparation of SiCOH (Low dielectric) nanoparticles proceeds by the injection of a 1%–5% weight solution of a suitable silicon precursor selected from siloxanes and silsesquioxanes into a hot solution (80°–120° C.) containing surfactants (the surface ligands specified above) and an organic solvent (typically octylether or phenylether) containing between about 0.1 and 1% water. The siloxane molecule may be selected to give the desired final composition of the SiCOH particles. The surfactant solution exhibits a microphase-segregated structure referred to as a reverse or inverse micelle. In this molecular solution, the water is sequestered in the small hydrophilic pockets formed by the aggregation of the surfactant in the non-polar solvent. Upon injection, the siloxane or silsesquioxane precursors disperse in the hot surfactant solution and are selectively hydrolyzed in the interior of the micelles forming low-density carbon-rich silicon oxide particles. The growth of the particles is limited to nanometer sizes by raising the temperature to about 140° C. after 5–10 minutes to distill out the water and stop the hydrolysis reaction and condense the growing polymer in a cross-linked particle. Continued heating of the reaction mixture tends to increase the density of the individual particles without further growth in size. The surfactant and surface agents coordinate the particle surface to stabilize the particles in solvent and prevent aggregation. The particles can then be extracted by cooling the solution and adding in a short chain alcohol (e.g., methanol or ethanol) or acetone. The purified particles can then be readily redispersed in hexane, octane, toluene, methylene-chloride or chloroform. Typically, the nanoparticles are suspended in the same or different solvent as used in suspending the oxide particles.

The nanoparticles and coated oxide particles are then added to a solution which contains one of the above-mentioned low-k dielectric binders (i.e., dielectric matrix) so as to form a precursor mixture. The solvent present in the solution of the low-k dielectric binder is typically an organic solvent such as acetone, hexane, ethanol or methanol. Other organic solvents can also be used in the present invention.

In this step of the present invention, typically from about 0.1 to about 10 wt. % of oxide particles, and from about 0.1 to about 10 wt. % of nanoparticles of SiCOH are added to about 1000 mls of said solution of low-k dielectric binder. More preferably, from about 1 to about 5 wt. % of coated oxide particles, and from about 1 to about 5 wt. % of nanoparticles of SiCOH are added to about 100 mls of said solution of low-k dielectric binder.

The ratio of coated oxide particles to nanoparticles added to the low-k dielectric binder is from about 1 to about 10, with a ratio of from about 2 to about 5 being more highly preferred.

Typically, in the present invention, it is preferred to maintain a solution viscosity of about 2 centipoise at 25° C. throughout the formation of the inventive low-k dielectric film. If needed, the viscosity of the mixture may be adjusted at this point of the present invention, or during any other time, by removing some of the solvent from the mixture using an evaporation step.

The precursor mixture containing coated oxide particles, nanoparticles of SiCOH and dielectric binder is then applied to a surface of a suitable substrate using a coating process well known to those skilled in the art including spin-coating, immersing, dip coating, and brushing. Of these various coating procedures, it is highly preferred in the present invention that the precursor mixture be spin-coated onto a surface of a substrate. When spin-coating is employed in the present invention, it is preferred to use a slow spreading step of about 500 rpm followed by a fast spin at about 3000 rpm.

Suitable substrates that may be employed in the present invention, include, but are not limited to: semiconductor wafers, metal lines and vias, diffusion barrier layers, conductive metals, other dielectrics including organic or inorganic dielectrics and combinations of these substrates. When a semiconductor wafer is employed as the substrate in the present invention, the wafer may include one or more active devices formed on or within a surface of the wafer. One possible substrate that can be employed in the present invention is shown, for example, in FIG. 2A.

The coated substrate is then subjected to various curing steps. One of the curing steps that may optionally be employed in the present invention is a hot baking step that is carried out at a temperature that is sufficiently high to remove residual solvent from the spin-coated film. This optional hot baking step is typically carried out on a hot plate in air at a temperature of from about 80° to about 200° C. for a time period of from about 1 to about 10 minutes.

A required curing step of the present invention is a partial curing step that provides ordering to the film, i.e., it fixes the water soluble or water vapor soluble oxide particles and nanoparticles on lattice sites within the film. Specifically, this partial curing and ordering step is carried out in a furnace using an inert ambient such as He, $N_2$ or Ar that includes less than about 50 ppm $O_2$ or $H_2O$ therein. The coated substrate is annealed in the furnace at a temperature of from about 200° to about 300° C. for a time period of from about 30 to about 120 minutes. Note that the temperature selected for the partial curing and ordering step is below that of crosslinking the low-k dielectric binder.

The final curing step, which is also required, is a curing step that is capable of crosslinking the low-k dielectric binder so as to form a low-k dielectric film having the above-mentioned components present therein. Specifically, this curing step is carried out at temperatures that are higher than the partial and ordering curing step mentioned above. In accordance with the present invention, the final curing step is carried out at a temperature of from about 350° to about 450° C. for a time period of from about 60 to about 240 minutes.

Following the above-mentioned curing steps, the cured film is then cooled to room temperature and then the cured film is immersed in water for a time period sufficient to remove the coated water soluble oxide particles from the film forming pores having the same diameter in the film. Alternatively, the cooled cured film may be placed in a tool in water vapor at high-pressures. Note that this step of the present invention only removes the water soluble (or water vapor soluble) oxide particles from the film; the nanoparticles and dielectric matrix are not affected by this step of the present invention. Typically, the immersing step of the present invention is carried out for a time period of from about 5 to about 120 minutes, with a time period of from about 10 to about 30 minutes being more highly preferred. Note that the immersing step typically is conducted at room temperature, but elevated temperatures of less than about 100° C. may also be employed in the present invention.

Following the immersing step, the film is then annealed in a furnace using a controlled ambient that has less than about 50 ppm of $O_2$ and $H_2O$. Typically, this annealing step is carried out at a temperature of from about 200° to about 400° C. for a time period of from about 1 to about 4 hours. It is noted that the purpose of the annealing step is to remove water and hydroxyl groups from the film. Thus, other temperatures and times besides those mentioned hereinabove that are capable of removing water and hydroxyl groups from the film may be employed in the present invention.

The above method results in the inventive porous, low-k dielectric film described above which offers the following advantages: (i) The inventive film has a low dielectric constant of about 2.0 or less, and preferably about 1.8 or less; (ii) The hardness and modulus of the inventive film are increased due to ordering of the nanometer scale pores, in comparison with films of the same density and dielectric constant in which the pores are disordered; (iii) The pores are separated by a low-k matrix, for example, methylsilsesquioxane (MSQ), phenylsilsesquioxane (PSQ), hydrogensilsesquioxane (HSQ) or HSQ-MSQ mixtures, and hence are not connected; (iv) The pores are uniform in size (diameter), and the pore diameter is controlled; (v) The pores are substantially uniformly spaced and are essentially periodic in location; and (vi) The interconnect wiring structure for ICs based on the inventive film have superior interconnect speed, and are mechanically stronger, i.e., they are more rigid, than conventional low-k films.

Interconnect wiring structures which include the inventive porous, low-k dielectric film of the present invention will now be described by referring to FIGS. 2A–B and 3. It is noted that the structures shown in these figures are made using conventional processing steps that are well known to those skilled in the art except for the low-k dielectric film which is prepared using the method described hereinabove.

Figure 2A:
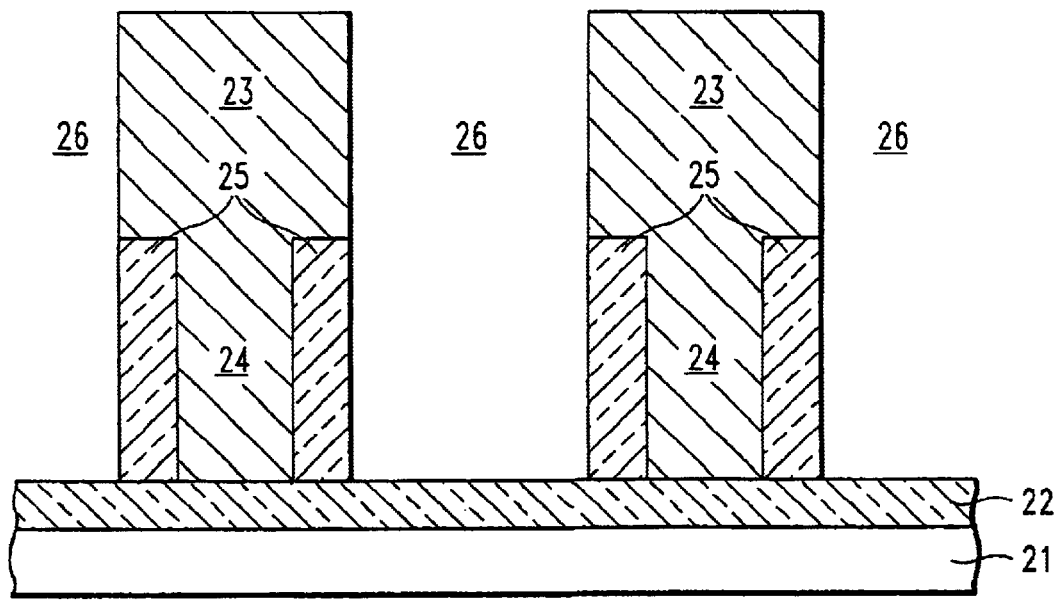
FIGS. 2A–B are cross-sectional views of a gapfill interconnect structure on an integrated circuit which includes the inventive porous, low-k dielectric film.
Figure 2B:
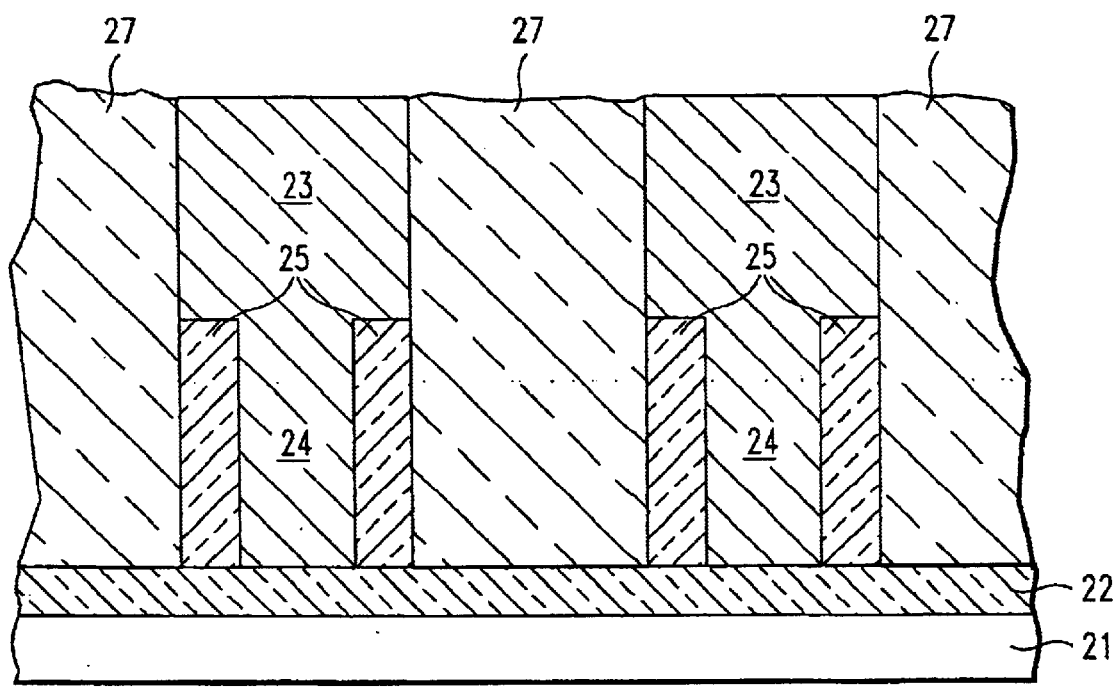

Reference is made first to FIGS. 2A–B, which are cross-sectional views of a gapfill type interconnect wiring structure on an IC that includes the inventive porous, low-k dielectric film. Specifically, the structure shown in FIG. 2A includes substrate 21 having integrated circuit elements (not shown in the drawings) formed thereon. Barrier layer 22 which is composed of a conventional material such as SiN, SiCH, or SiNCH separates the top structure from the pre-existing integrated elements. Patterned conductive lines 23 and vias 24 are formed using conventional processes into structural dielectric 25. The conductive lines and vias are composed of a conventional conductive material such as Cu, Al, W, Pt, and alloys or combinations thereof, while the structural dielectric is composed of any conventional dielectric including low-k or high-k inorganic or organic dielectrics. In FIG. 2A, empty spaces 26 exist between the conductive lines and vias.

In FIG. 2B, the inventive low-k dielectric film 27 is formed onto the substrate shown in FIG. 2A using the method of the present invention, followed by a conventional planarization process such as chemical-mechanical polishing (CMP).

Figure 3:
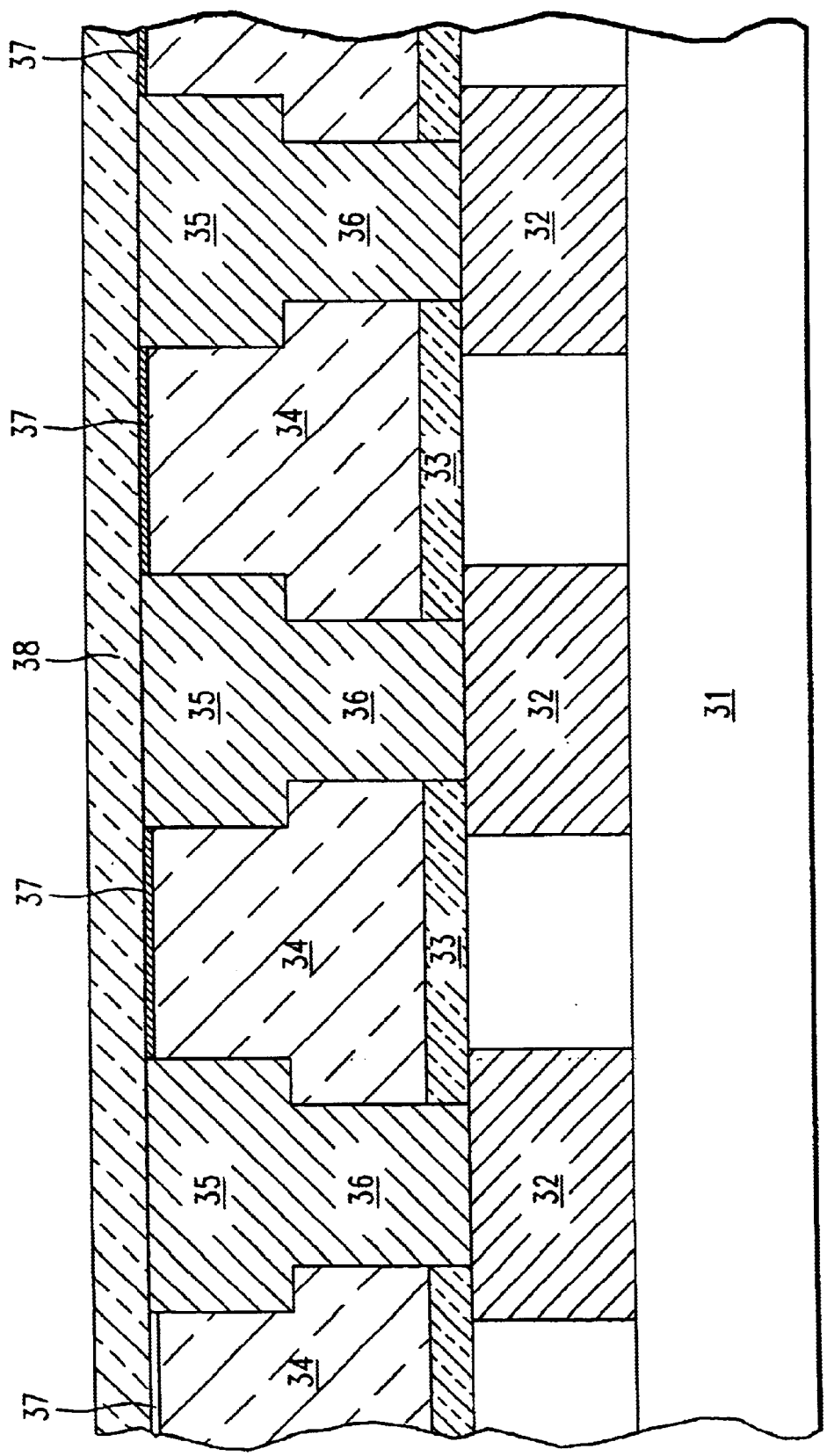
FIG. 3 is a cross-sectional view of a dual damascene type interconnect wiring structure on an integrated circuit which includes the inventive porous, low-k dielectric film.

FIG. 3 is a cross-sectional view of a dual damascene type interconnect structure on an integrated circuit which includes the inventive porous, low-k dielectric film. Specifically, in FIG. 3, substrate 31 contains IC elements, including a plurality of metal conductive elements 32. Barrier layer 33 is formed over the metal conductive elements and is then patterned by etching. The structure also includes inventive porous, low-k dielectric film 34 which is formed using the method of the present invention and thereafter hardmask 37 is applied and the structure is then patterned (lithography and etching) so as to have via and line openings therein. The via and lines opening are then filled with a conductive metal providing conductive filled vias 36 and conductive filled lines 35. The structure is thereafter planarized by chemical-mechanical polishing (CMP) so as to provide the structure shown in FIG. 3. Capping barrier layer 38 such as SiN, SiCH, or SiNCH is then formed over the planarized structure.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A porous, low-k dielectric film comprising:
   a first phase of monodispersed pores having a diameter of from about 1 to about 10 nm that are substantially uniformly spaced apart and are essentially located on sites of a three-dimensional periodic lattice; and
   a second phase surrounding said first phase, wherein said second phase is a solid phase which includes (i) an ordered element that is composed of nanoparticles having a diameter of from about 1 to about 10 nm that are substantially uniformly spaced apart and are essentially arranged on sites of a three-dimensional periodic lattice, and (ii) a disordered element comprised of a dielectric material having a dielectric constant of less than about 2.8.

2. The porous, low-k dielectric film of claim 1 wherein said nanoparticles are comprised of Si, C, O and H.

3. The porous, low-k dielectric film of claim 1 wherein said film has an effective dielectric constant of less than about 2.0.

4. The porous, low-k dielectric film of claim 1 wherein said film has an effective dielectric constant of about 1.8 or less.

5. The porous, low-k dielectric film of claim 1 wherein said monodispersed pores have a diameter of from about 1 to about 5 nm.

6. The porous, low-k dielectric film of claim 5 wherein said monodispersed pores have a diameter of about 3 nm.

7. The porous, low-k dielectric film of claim 1 wherein said pores are separated by a center-center distance $V_{cc}$, wherein $V_{cc}$ between each pore is from about 2 to about 10 nm.

8. The porous, low-k dielectric film of claim 7 wherein $V_{cc}$ between each pore is from about 3 to about 6 nm.

9. The porous, low-k dielectric film of claim 1 wherein said pores are separated by an edge-edge distance $V_{ee}$, wherein $V_{ee}$ between each pore is from about 1 to about 8 nm.

10. The porous, low-k dielectric film of claim 9 wherein $V_{ee}$ between each pore is from about 2 to about 5 nm.

11. The porous, low-k dielectric film of claim 1 wherein said pores and said nanoparticles are separated by a distance AB, wherein AB is from about 1 to about 10 nm.

12. The porous, low-k dielectric film of claim 11 wherein AB is from about 2 to about 5 nm.

13. The porous, low-k dielectric film of claim 1 wherein said nanoparticles have a diameter of from about 2 to about 3.0 nm.

14. The porous, low-k dielectric film of claim 1 wherein said dielectric material having a dielectric constant of less than about 2.8 is selected from the group consisting of polyarylene ethers, thermosetting polyarylene ethers, aromatic thermosetting resins, Si-containing polymers, amorphous alloys comprised of Si, C, O and H that may, or may not, be doped with oxide, methylsilsesquioxane (MSQ), hydrogensilsesquioxane (HSQ), phenylsilsesquioxane (PSQ), and mixtures or complexes thereof.

15. The porous, low-k dielectric film of claim 14 wherein said dielectric material having a dielectric consent of less than about 2.8 is MSQ, HSQ, PSQ or a mixture of MSQ and HSQ.

16. The porous, low-k dielectric film of claim 1 wherein said film has a hardness of about 0.2 GPa or greater.

17. The porous, low-k dielectric film of claim 16 wherein said film has a hardness of from about 0.2 to about 0.4 GPa.

18. The porous, low-k dielectric film of claim 1 wherein said film has a Modulus of about 2.0 GPa or greater.

19. The porous, low-k dielectric film of claim 18 wherein said film has a Modulus of from about 2 to about 4 GPa.

20. An interconnect structure which includes at least a porous, low-k dielectric film formed between metal wiring features, wherein said porous, low-k dielectric film comprises a first phase of monodispersed pores having a diameter of from about 1 to about 10 nm that are substantially uniformly spaced apart and are essentially located on sites of a three-dimensional periodic lattice; and a second phase surrounding said first phase, wherein said second phase is a solid phase which includes (i) an ordered element that is composed of nanoparticles having a diameter of from about 1 to about 10 nm that are substantially uniformly spaced apart and are essentially arranged on sites of a three-dimensional periodic lattice, and (ii) a disordered element comprised of a dielectric material having a dielectric constant of about 2.8 or less.

21. The interconnect structure of claim 20 wherein said nanoparticles are comprised of Si, C, O and H.

22. The interconnect structure of claim 20 wherein said film has an effective dielectric constant of less than about 2.0.

23. The interconnect structure of claim 22 wherein said film has an effective dielectric constant of about 1.8 or less.

24. The interconnect structure of claim 20 wherein said monodispersed pores have a particle diameter of from about 1 to about 5 nm.

25. The interconnect structure of claim 20 wherein said monodispersed pores have a particle diameter of about 3 nm.

26. The interconnect structure of claim 20 wherein said pores are separated by a center-center distance $V_{cc}$, wherein $V_{cc}$ between each pore is from about 2 to about 10 nm.

27. The interconnect structure of claim 26 wherein $V_{cc}$ between each pore is from about 3 to about 6 nm.

28. The interconnect structure of claim 20 wherein said pores are separated by an edge-edge distance $V_{ee}$, wherein $V_{ee}$ between each pore is from about 1 to about 8 nm.

29. The interconnect structure of claim 28 wherein $V_{ee}$ between each pore is from about 2 to about 5 nm.

30. The interconnect structure of claim 20 wherein said pores and said nanoparticles are separated by a distance AB, wherein AB is from about 1 to about 10 nm.

31. The interconnect structure of claim 30 wherein AB is from about 2 to about 5 nm.

32. The interconnect structure of claim 20 wherein said nanoparticles have a diameter of from about 2 to about 3.0 nm.

33. The interconnect structure of claim 20 wherein said dielectric material having a dielectric constant of about 2.8 or less is selected from the group consisting of polyarylene ethers, thermosetting polyarylene ethers, aromatic thermosetting resins, Si-containing polymers, amorphous alloys comprised of Si, C, O and H that may, or may not, be doped with oxide, methylsilsesquioxane (MSQ), hydrogensilsesquioxane (HSQ), phenylsilsesquioxane (PSQ), and mixtures or complexes thereof.

34. The interconnect structure of claim 33 wherein said dielectric material having a dielectric constant of 2.8 or less is MSQ, HSQ, PSQ or a mixture of MSQ and HSQ.

35. The interconnect structure of claim 20 wherein said metal wiring features are metal lines or vias.

36. The interconnect structure of claim 20 wherein said metal wiring features are composed of a conductive metal selected from the group consisting of Cu, Al, W, Pt and alloys or combinations thereof.

37. The interconnect structure of claim 20 further comprising a substrate.

38. The interconnect structure of claim 37 wherein said substrate is a semiconductor wafer, a dielectric layer, a barrier layer or a combination thereof.

39. The interconnect structure of claim 20 wherein said structure is a dual damascene structure.

40. The interconnect structure of claim 20 wherein said structure is a gapfill structure.

41. A method of fabricating a porous, low-k dielectric film comprising the steps of:
(a) coating a suspension of water soluble or water vapor soluble oxide particles with a surface ligand group which is effective in preventing agglomeration of said water soluble or water vapor soluble oxide particles, yet maintains solubility of the oxide particles in said suspension, while separating forming monodispersed SiCOH particles having a particle diameter of from about 1 to about 10 nm;
(b) adding said coated water soluble or water vapor soluble oxide particles and said monodispersed particles to a solution containing a dielectric binder material having a dielectric constant of about 2.8 or less so as to form a precursor mixture;
(c) coating said precursor mixture on to a surface of a substrate;

(d) subjecting said coated precursor mixture to a curing process, said curing process including at least a step which is capable of ordering of said particles in a three-dimensional lattice and a step of forming a crosslinked film;

(e) removing said coated water soluble or water vapor soluble oxide particles from said crosslinked film so as to form pores in said film; and (f) annealing said film containing said pores so as to remove residual water and hydroxyl groups from said film, wherein said film comprises a first phase of monodispersed pores having a diameter of from about 1 to about 10 nm that are substantially uniformly spaced apart and are essentially located on sites of a three-dimensional periodic lattice; and a second phase surrounding said first phase, wherein said second phase is a solid phase which includes (i) an ordered element that is composed of nanoparticles having a diameter of from about 1 to about 10 nm that are substantially uniformly spaced apart and are essentially arranged on sites of a three-dimensional periodic lattice, and (ii) a disordered element comprised of said binder.

42. The method of claim 41 wherein said monodispersed particles are comprised of Si, C and H and said nanoparticles are comprised of Si, C, O and H.

43. The method of claim 41 wherein said oxide particles are silicon oxide, germanium oxide, or mixtures thereof.

44. The method of claim 41 wherein said suspension includes a solvent selected from the group consisting of an alcohol, an alkane, a ketone, an ether, an aromatic, and a carboxylic acid.

45. The method of claim 41 wherein said surface ligand group is selected from the group consisting of an organosilane, an organohalosilane, germanium analogs of said organosilane or organohalosilane, long chain carboxylic acids containing from 4 to 18 carbon atoms, long chain alcohols containing from 4 to 18 carbon atoms, long chain alkylamines containing from 4 to 18 carbon atoms, long chain phosphonic acids containing from 4 to 18 carbon atoms, and long chain sulfonic acids containing from 4 to 18 carbon atoms.

46. The method of claim 41 wherein said dielectric binder is selected from the group consisting of polyarylene ethers, thermosetting polyarylene ethers, aromatic thermosetting resins, Si-containing polymers, amorphous alloys comprised of Si, C, O and H that may, or may not, be doped with oxide, methylsilsesquioxane (MSQ), hydrogensilsesquioxane (HSQ), phenylsilsesquioxane (PSQ), and mixtures or complexes thereof.

47. The method of claim 46 wherein said dielectric binder is MSQ, HSQ, PSQ or a mixture of MSQ and HSQ.

48. The method of claim 41 wherein said coating step is a spin-coating process.

49. The method of claim 41 wherein said curing process includes an optional hot bake process.

50. The method of claim 49 wherein said optional hot bake process is carried out on a hot plate in air at a temperature of from about 80° to about 200° C. for a time period of from about 1 to about 10 minutes.

51. The method of claim 41 wherein said ordering curing step is carried out in a furnace using an inert ambient that includes less than about 50 ppm $O_2$ or $H_2O$.

52. The method of claim 51 wherein said ordering curing step is carried out at a temperature of from about 200° to about 300° C. for a time period of from about 30 to about 120 minutes.

53. The method of claim 41 wherein said crosslinking curing step is carried out at a temperature of from about 350° to about 450° C. for a time period of from about 60 to about 240 minutes.

54. The method of claim 41 wherein step (e) includes immersing said crosslinked film in water or exposing said crosslinked film to water vapor.

55. The method of claim 41 wherein said annealing step out in a furnace using an ambient that includes less than about 50 ppm $O_2$ or $H_2O$.

56. The method of claim 55 wherein said annealing step is carried out at a temperature of from about 200° to about 400° C. for a time period of from about 60 to about 240 minutes.

57. The method of claim 41 wherein step (a) includes injecting 1 to 5 weight % of a solution containing a silicon precursor into a hot solution containing said surface ligand and an organic solvent containing between 0.1 to 1% water.

* * * * *